US006635817B2

(12) United States Patent
Chang

(10) Patent No.: US 6,635,817 B2
(45) Date of Patent: Oct. 21, 2003

(54) SOLAR CELL ARRAY HAVING LATTICE OR MATRIX STRUCTURE AND METHOD OF ARRANGING SOLAR CELLS AND PANELS

(75) Inventor: Chin Chang, Yorktown Heights, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 14 days.

(21) Appl. No.: 10/011,894

(22) Filed: Dec. 6, 2001

(65) Prior Publication Data

US 2003/0106579 A1 Jun. 12, 2003

(51) Int. Cl.[7] .................. H01L 31/042; H01L 31/05
(52) U.S. Cl. .................. 136/244; 136/291; 136/293; 323/906; 323/221; 307/43; 307/71
(58) Field of Search .................. 136/244, 291, 136/293; 323/906, 221; 307/43, 71

(56) References Cited

U.S. PATENT DOCUMENTS 3,866,060 A * 2/1975 Bannister et al. .............. 307/43
4,513,167 A * 4/1985 Brandstetter .................. 136/244
4,788,449 A * 11/1988 Katz ............................ 307/43
5,637,155 A * 6/1997 Inoue ........................... 136/244
6,350,944 B1 * 2/2002 Sherif et al. .................. 136/244

FOREIGN PATENT DOCUMENTS

EP    1039361 A1 *  9/2000
GB    2128017 A   *  4/1984

* cited by examiner

Primary Examiner—Alan Diamond

(57) ABSTRACT

A solar cell array is provided having a lattice or matrix structure such that no two solar cell devices are connected purely in series or purely in parallel. Accordingly, if a single solar cell device fails, there is an alternate path by which the output power of all other solar cell devices may contribute to the total output power of the solar cell array. Also, the power output of the entire array is much less sensitive to a low voltage or current for a single solar cell device than in a conventional array where devices are connected in series and in parallel. Beneficially, current setting devices, such as resistors, are provided for better matching the voltages and currents within the array, although in some applications, the resistors can be eliminated, or set to zero. The lattice or matrix structures may be extended in one, two, and three-dimensional patterns.

23 Claims, 9 Drawing Sheets

SOLAR CELL ARRAY HAVING LATTICE OR MATRIX STRUCTURE AND METHOD OF ARRANGING SOLAR CELLS AND PANELS

BACKGROUND AND SUMMARY OF THE INVENTION

1) Field of the Invention

This invention pertains to the field of solar cell arrays, and more particularly, to a system and method of arranging solar cells to increase output power of a solar cell array.

2) Background and Summary of the Invention

As the supplies of fossil fuels continue to be subject to volatility, alternative energy sources continue to be investigated. In particular, solar energy is seen as a large potential source of energy which remains as yet largely untapped. Accordingly, research continues into improved solar energy devices, including particularly, solar cells and solar cell arrays.

The most common form of solar cells is based on the photovoltaic (PV) effect in which light falling on a two-layer semiconductor device produces a photovoltage or potential difference between the layers. A single PV solar cell typically produces a working output voltage of about 0.5 volts and a current that changes depending upon the intensity of light to which the cell is exposed. For example, a PV solar cell might produce a current of 100–500 mA when exposed to bright light.

An important characteristic of such a solar cell is that the cell's working output voltage does not depend on its size, and also remains fairly constant with changing light intensity on the cell. However, the current produced by a PV solar cell is almost directly proportional to its size and to the intensity of light received by the cell. Also, although the current output by the cell is relatively stable at higher temperatures, the working output voltage drops at higher temperatures, producing a drop in solar cell output power as the cell temperature increases.

Because, as noted above, a single PV solar cell has a typical working voltage of about 0.5 V, typically a plurality of such cells are connected together in series to provide larger working voltages. Currently, there are three basic categories of devices: (1) low voltage/low power devices made by connecting 3–12 small PV cells (typically amorphous silicon devices) in series to produce 1.5–6V; (2) small solar panels having many cells connected in series and producing 3–12V and 1–10 watts; and (3) large solar panels, usually composed of 10–36 full-sized cells connected in series, producing 6–12V and 10–60 watts.

In applications requiring more power than a single solar panel can provide, larger systems are made by linking together a number of solar panels. For example, a solar array consisting of 90 solar panels is sometimes used in building construction for the dual purposes of providing a wall and providing electric power to the building.

FIG. 1 shows the arrangement of a typical conventional solar cell array 100. As can be seen, the array 100 comprises M rows, each row having N solar cells 110 connected in series, wherein the M rows are all connected together in parallel. If all of the solar cells 110 have an exact same output voltage of P volts, and each solar cell 110 produces an exact same output current of R mA, then the output voltage of the solar cell array 100 would be N*P volts, and the output current would be M*R mA. So the output voltages and current capabilities of multiple solar cells 110 may be combined via the solar cell array 100.

However, there are certain shortcomings produced by the series/parallel configured solar cell array 100 shown in FIG. 1.

First, in the case of a failure of any single solar cell, an entire row of solar cells in the solar cell array 100 is lost. That is, the array has a single-point failure, which is undesirable.

Second, the output voltages of the solar cells are not all exactly the same. Typically, there is a voltage variation between solar cells, depending upon the variation of the solar cells. This voltage variation between solar cells causes a drop in total output power in the solar cell array 100 as the lower voltage solar cell rows are limited by the higher voltage solar cell rows (i.e., the "bottleneck" row(s)).

Third, whenever sunlight is not cast evenly upon the solar cell array 100, such as when part of the solar cell array 100 is in the shade or a shadow, the solar cells receiving more light will produce a greater current than the solar cells receiving less light. In that case, the current output by each row of the array will be limited to the lowest current produced by any one solar cell in the row (i.e., the "bottleneck" solar cell). This, in turn, causes a drop in output power for the solar cell array 100.

Also, whenever a certain solar panel in the solar cell array 100 is replaced due to failure or damage, the new solar panel is likely to have a different terminal voltage, affecting the output voltage and current of the solar cell array 100.

Accordingly, it would be desirable to provide a system and method for arranging solar cells in an array having a power output that is substantially less limited by bottleneck solar cells and rows or panels. The present invention is directed to addressing one or more of the preceding concerns by providing new connections.

In one aspect of the invention, a solar cell array, comprises a first four-port unit having first and second input ports and first and second output ports; and a second four-port unit also having first and second input ports and first and second output ports, wherein the first and second output ports of the first four-port unit are connected to the first and second input ports of the second four-port unit, and wherein each four-port unit comprises, a first solar cell device connected between the first input port and the first output port, a second solar cell device connected between the first input port and the second output port, a third solar cell device connected between the second input port and the first output port, and a fourth solar cell device connected between the second input port and the second output port.

In another aspect of the invention, a solar cell array comprises a plurality of electrically-conductive branches, said branches coupled in parallel, each of said branches comprising at least one solar cell device; and a plurality of shunts, wherein each one of said shunts couples an low voltage terminal of a solar cell device in one of said branches directly to a high voltage terminal of a corresponding solar cell device in an adjacent one of said branches, such that a corresponding set of solar cell devices together with their corresponding coupling shunts define a lattice-connected unit, and wherein said system comprises at least two said units, and said branches along with said shunts are coupled to form a cascaded-cell lattice arrangement having a respective node in each branch between adjoining cells.

In still another aspect of the invention, a method of producing electrical power, comprises the steps of coupling in parallel a plurality of electrically-conductive branches, with said branches forming at least two cascaded units having a respective node in each branch between adjoining units, wherein in each said unit, each said branch has a solar cell device producing electrical power and having a low voltage terminal and a high voltage terminal; and within each unit, coupling the low voltage terminal of each said solar cell device directly to the high voltage terminal of a solar cell device of an adjacent branch via a shunt; and providing the electrical power from the solar cell devices through input and output terminals connected to said branches.

DESCRIPTION OF THE PREFERRED EMBODIMENTS

Figure 2:
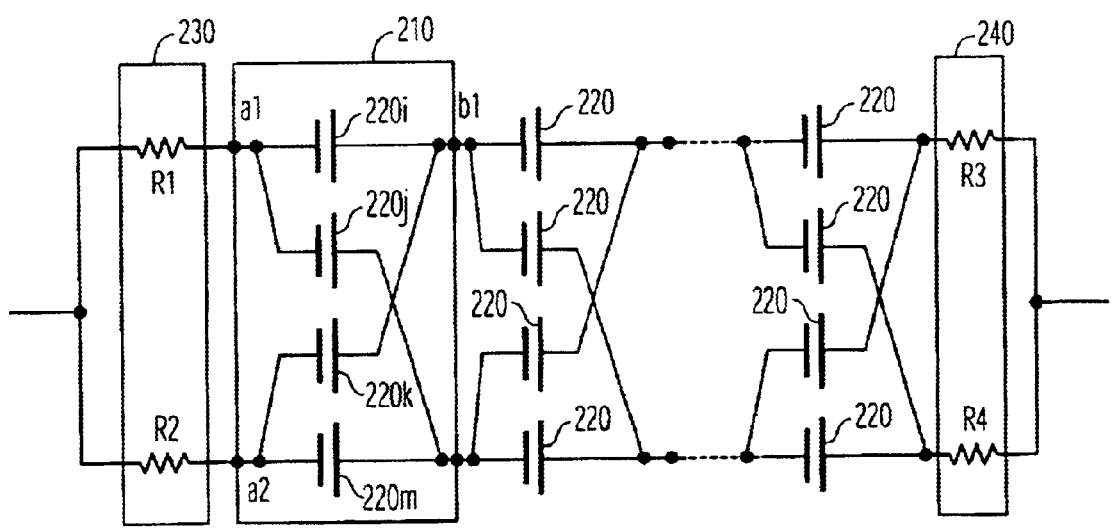
FIG. 2 shows a solar cell array having a lattice structure.

FIG. 2 shows a solar cell array 200 having a lattice structure. The solar cell array 200 comprises a plurality (1 to X) of four-port units 210, each comprising a plurality of cross-connected solar cell devices 220. Each four-port unit 210 includes input ports a1 and a2 and output ports b1 and b2. The X four-port units 210 are connected in series, such that the output ports b1 and b2 of each four-port unit 210 are connected to the input ports a1 and a2, respectively, of the succeeding four-port unit 210. As shown in FIG. 2, the input ports a1, a2, of the first four-port unit 210 are beneficially connected together via first current adjusting means 230. Also, the output ports b1, b2 of the last ($X^{th}$) four-port unit 210 are connected together via second current adjusting means 240.

In FIG. 2, each four-port unit 210 comprises first through fourth solar cell devices 220$i$ through 220$m$. The input port a1 is connected to a low voltage side (input) of solar cell devices 220$i$ and 220$j$, while the input port a2 is connected to a low voltage side (input) of solar cell devices 220$k$ and 220$m$. Meanwhile, the output port b1 is connected to a high voltage side (output) of solar cell devices 220$i$ and 220$k$, while the output port b2 is connected to a high voltage side (output) of solar cell devices 220$j$ and 220$m$.

A solar cell device 220 is a two-port device that receives light energy and produces therefrom an output voltage and current. Beneficially, each solar cell device 220 may comprise a photovoltaic (PV) solar cell. Also, a solar cell device 220 may comprise a plurality of solar cells connected together in series. Moreover, a solar cell device 220 may comprise a solar panel or solar module array. In that case, the solar panel beneficially comprises a plurality of solar cells connected together to produce and output voltage and current. Such a solar panel may be configured such as the solar cell array 100, or it may itself be configured of a plurality of cross-connected solar cells. That is, each solar cell device 220 of the solar cell array 200 may itself be a solar cell array having a lattice structure.

Beneficially, the current adjusting means 230 comprises first and second resistors R1 and R2, and the current adjusting means 240 comprises first and second resistors R3 and R4. In that case, the values of the resistors R1 through R4 are beneficially selected to optimize the output power of the array 200 by minimizing power that is wasted by one solar cell device driving a second solar cell device. Optionally, one or all of the resistors R1 through R4 may be eliminated, with a possible reduction in the power output by the solar cell array 200.

From examination of FIG. 2, one can see that no two solar cell devices form an independent series or parallel connection. That is, for example, although solar cell device 220$i$ forms one series path with solar cell devices 220$n$ and 220$r$, it also forms a second, parallel, series path with solar cell devices 220$o$ and 220$u$. Accordingly, if a single solar cell device 220 fails, there is an alternate path by which the output power of all other solar cell devices 220 may contribute to the total output power of the solar cell array 200.

Figure 1:
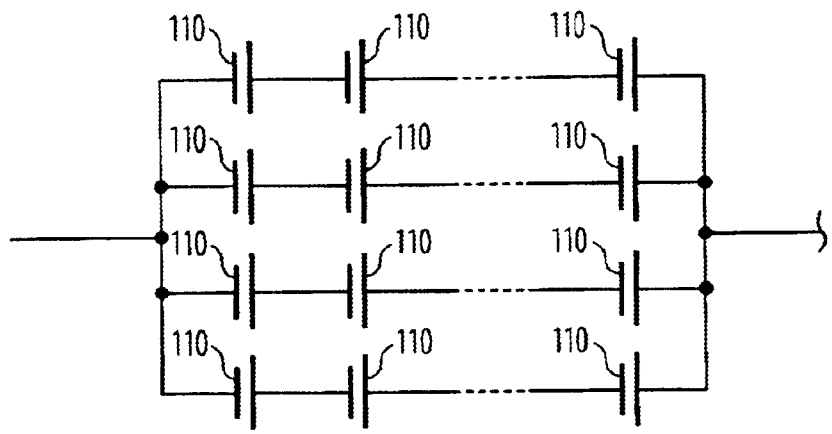
FIG. 1 shows a conventional solar cell array structure.

Also, in the solar cell array 200, the power output of the entire array is much less sensitive to a low voltage or current for a single solar cell device than in the conventional array 100 shown in FIG. 1. Accordingly if, e.g., the solar cell device 220$n$ has a reduced current (perhaps because it is in the shade), the current through the solar cell device 220$i$ is not thereby completely limited, as it has an alternate path through the solar cell devices 220$o$ and 220$u$.

Figure 3:
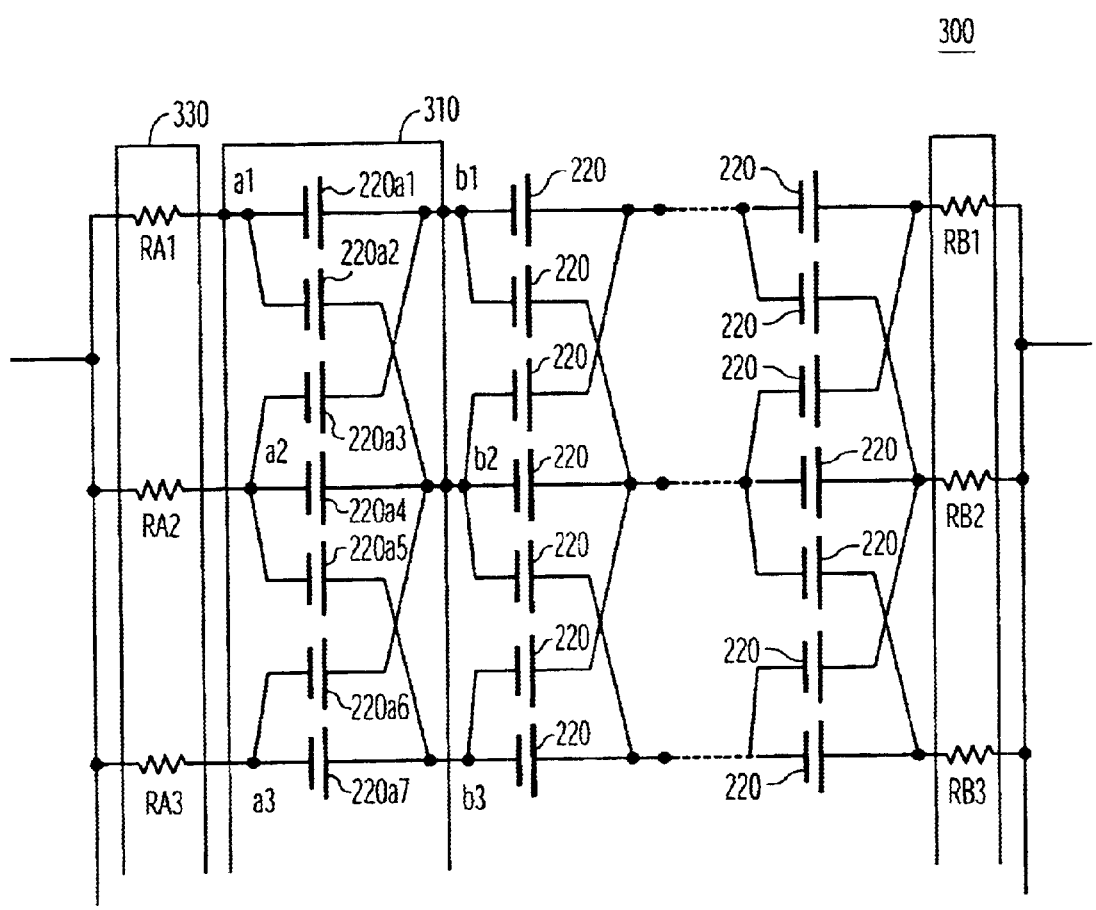
FIG. 3 shows another solar cell array having a lattice structure.

FIG. 3 shows another solar cell array 300 having a lattice structure. The solar cell array 300 comprises a plurality (Y) of Z-port units 310, each Z-port unit 310 comprising a plurality of cross-connected solar cell devices 220. In FIG. 3, same-numbered elements represent the same elements shown and described above with respect to FIG. 2. Accordingly, description of these elements will not be repeated here.

The solar cell array 300 is similar to the solar cell array 200, except that is a two-dimensional extension of the lattice structure. Each Z-port unit 310 includes input ports a1, a2, ... aZ, and output ports b1, b2 ... bZ. The Y Z-port units 310 are connected in series, such that the output ports b1, b2, ... bZ of each Z-port unit 310 are connected to the input ports a1, a2, ... aZ respectively, of the succeeding Z-port unit 310. As shown in FIG. 3, the Z input ports a1, a2, ... aZ of the first Z-port unit 310 are beneficially connected together via first current adjusting means 330. Also, the output ports b1, b2, ... bZ of the last ($Y^{th}$) Z-port unit 310 are connected together via second current adjusting means 340.

In FIG. 3, each Z-port unit 310 comprises first through $W^{th}$ solar cell devices 220, where W=3Z−2. The first input port a1 is connected to a low voltage side (input) of two solar cell devices 220a1 and 220a2, while the first output port b1 is connected to a high voltage side (output) of solar cell devices 220a1 and 220a3. Meanwhile, the input port a2 is connected to a low voltage side (input) of solar cell devices 220a3, 220a4, and 220a5. Meanwhile, the output port b2 is connected to a high voltage side (output) of solar cell devices 220a2, 220a4, and 220a6. In general, for i=2 . . . Z−1, the input port a1 is connected to solar cell devices 220a(J−1), 220aJ, and 220a(J+1), where J=3i−2. Finally, the input port aZ is connected to solar cell devices 220a(W−1) and 220aW.

Beneficially, the current adjusting means 330 comprises first through $Z^{th}$ resistors RA1, RA2, . . . RAZ, and the current adjusting means 340 comprises first through $Z^{th}$ resistors RB1, RB2, . . . RBZ. In that case, the values of the resistors RA1, RA2, . . . RAZ and RB1, RB2, . . . RBZ are beneficially selected to optimize the output power of the array 300 by minimizing power that is wasted by one solar cell device driving a second solar cell device. Optionally, one or more of the resistors RA1, RA2, . . . RAZ and RB1, RB2, . . . RBZ may be eliminated, with a possible reduction in the power output by the solar cell array 300.

Accordingly, FIG. 3 shows how a solar cell array may be configured with a two-dimensional lattice structure. In accordance with principles of the present invention, it is possible to configure a solar cell array with a three-dimensional lattice structure.

Figure 4A:
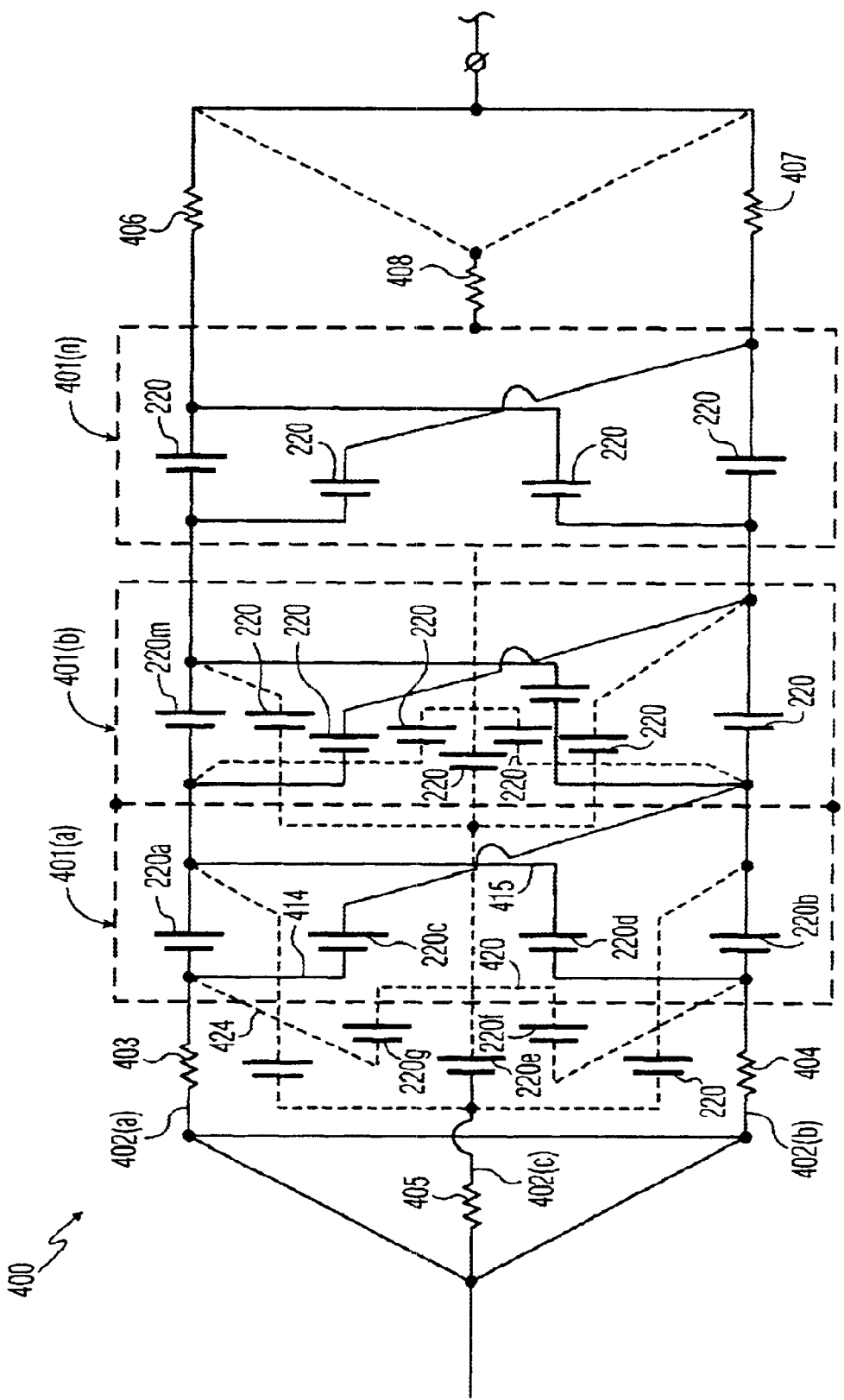
FIG. 4A illustrates a three-dimensional arrangement of solar cell devices.

FIG. 4A shows a solar cell array 400 having a three-dimensional lattice structure. The solar cell array 400 comprises a plurality of branches, wherein the branches are configured to form a three-dimensional arrangement. It is noted that, in accordance with various embodiments of the present invention, the arrangement may be configured such that each of the solar cell devices 220 is arranged on a solar panel.

Figure 4B:
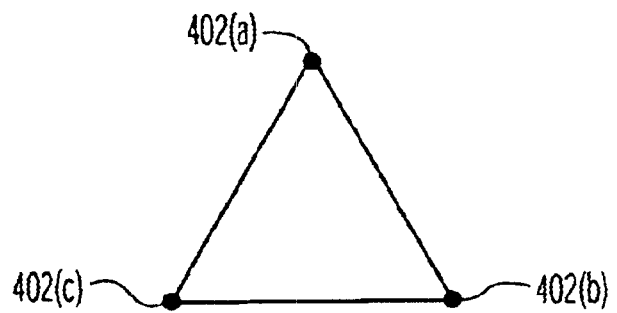
FIG. 4B illustrates a cross-section of a three-dimensional arrangement of solar cell devices according to FIG. 4A.
Figure 4C:
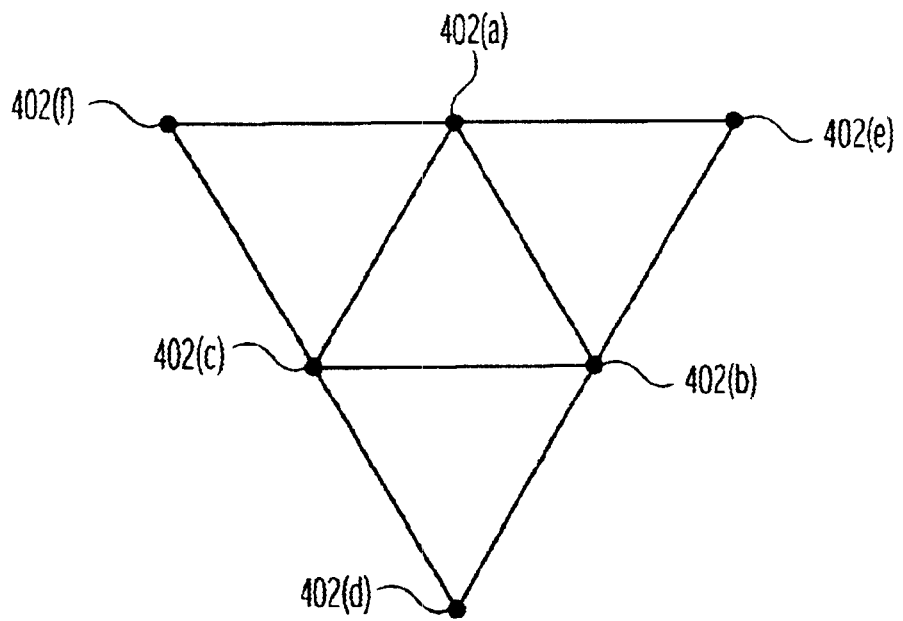
FIG. 4C illustrates an extended cross-section of a three-dimensional arrangement of solar cell devices according to FIG. 4A.

In the embodiment shown, the solar cell array 400 comprises three branches and has a triangular cross-section. The triangular cross-section is also illustrated in FIG. 4B, although the present invention is not limited in scope in this regard. Each of the branches 402(a), 402(b) and 402(c) of FIG. 4A is designated as branch end nodes 402(a), 402(b) and 402(c) in FIG. 4B. FIG. 4C illustrates another embodiment, in which the triangular cross-section is repeated, on each of its sides, so as to form three additional triangular cross-sections, with a total of six branches, wherein the end of each branch is designated by branch end nodes 402(a) through 402(f). The present invention contemplates that any number of branches and any shape of cross-section may be employed.

Returning to FIG. 4A, each branch has solar cell devices 220 that are connected in series. A set of corresponding solar cell devices 220 of all branches defines a unit. The arrangement shown in FIG. 4A illustrates cascading units 401(a), 401(b) through 401(n) of solar cell devices 220. It is noted that, in accordance with various embodiments of the present invention, any number of units may be formed.

Each unit 401 of the solar cell array 400 comprises a first solar cell device 220a of branch 402(a), a first solar cell device 220b of branch 402(b), and first solar cell device 220c of branch 402(c). Each of the branches having the first solar cell devices 220 are initially (i.e.—before the first unit) coupled in parallel via current limiting means (such as resistors 403, 404 and 405). Additional resistors 406, 407 and 408 are employed at the output terminals of the last a solar cell devices 220 in each branch. Beneficially, the values of the resistors 403–408 are selected to optimize the output power of the array 400 by minimizing power that is wasted by one solar cell device driving a second solar cell device. Optionally, one or all of the resistors 403–408 may be eliminated, with a possible reduction in the power output by the solar cell array 400.

The low voltage side (input) of the solar cell device 220 in each branch is coupled to the high voltage side (output) of corresponding solar cell devices 220 in adjacent branches. For example, the low voltage side (input) of the solar cell device 220a is connected to the high voltage side (output) of the solar cell device 220b by a shunt (such as shunt 414) having a solar cell device 220 (such as the solar cell device 220c) connected therein. Furthermore, the low voltage side (input) of the first solar cell device 220a is connected to the high voltage side (output) of solar cell device 220e by a shunt (such as shunt 424) having solar cell device 220 (such as solar cell device 220g) connected therein.

Similarly, the low voltage side (input) of the solar cell device 220b is connected to the high voltage side (output) of the solar cell device 220a by a shunt (such as shunt 415) having a solar cell device 220 (such as solar cell device 220d) connected therein. The low voltage side (input) of the solar cell device 220b is also connected to the high voltage side (output) of the solar cell device 220e by a shunt (such as shunt 420) having a solar cell device 220 (such as a solar cell device 220f) connected therein.

A solar cell array 400 which is connected according to the arrangement shown in FIG. 4A in general has an improved power output level and increased level of reliability compared to a solar cell array in which the solar cell devices are connected according to the arrangement shown in FIG. 1. For example, in open-circuit failure mode, an entire branch is not lost because of the failure of a single solar cell device 220 in that branch. Instead, the shunts 414, 415, etc. bypass the failed solar cell device 220. For instance, if the solar cell device 220a of FIG. 4A fails, power from solar cell device 220m is still combined in the array via branch 402(b) and solar cell device 220d, and via branch 402(c) and solar cell device 220h. In addition, power from branch 402(a) still flows to adjacent branches 402(b) and 402(c) via shunts 414 and 424, respectively.

Because solar cell devices 220 in each unit are not parallel-connected or purely serially-connected, the voltage and current produced by each solar cell device 220 does not need to be the same.

Figure 5A:
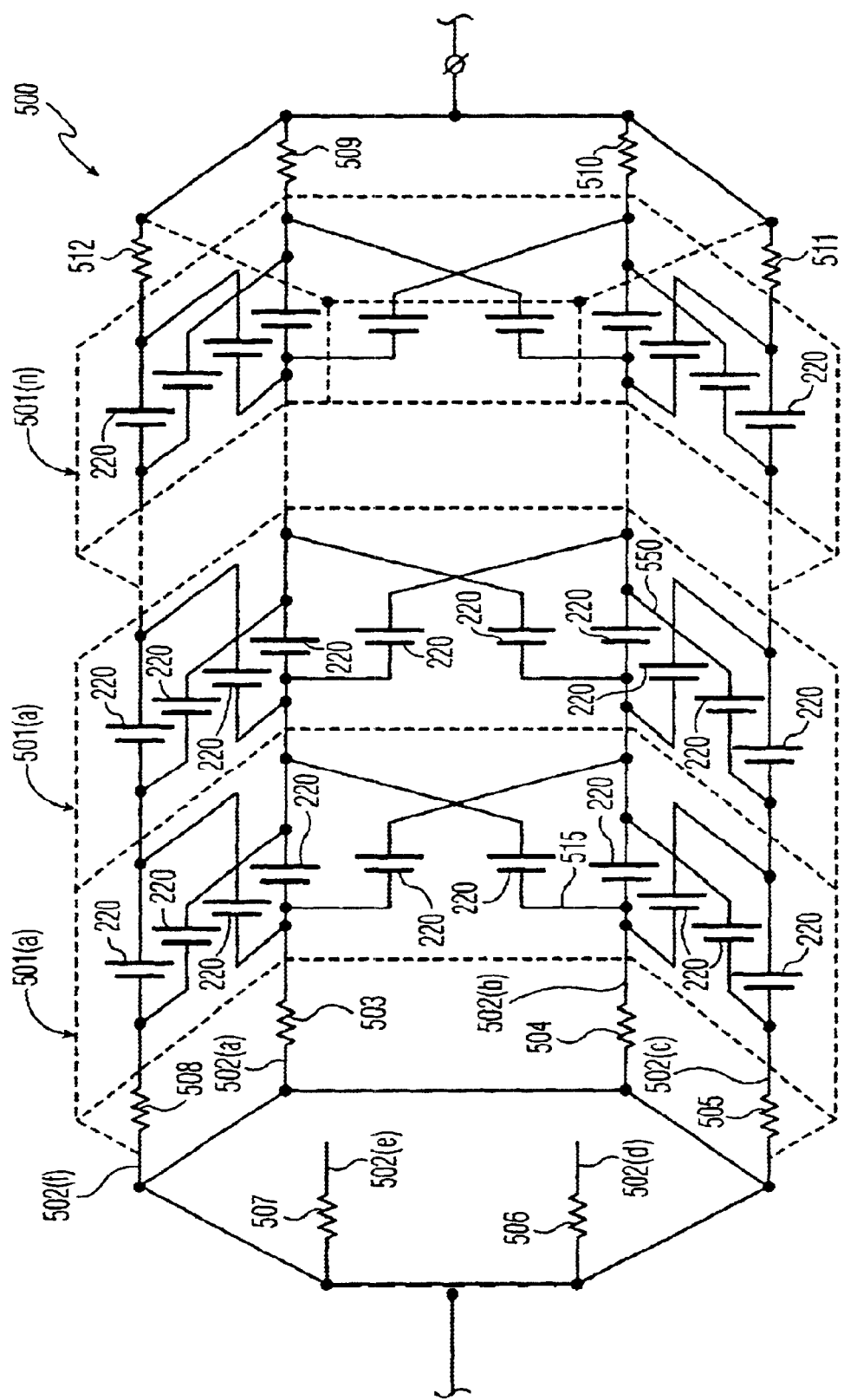
FIG. 5A illustrates another three-dimensional arrangement of solar cell devices.

FIG. 5A illustrates a three-dimensional arrangement 500 of solar cell devices 220, according to another embodiment of the present invention. The arrangement shown in FIG. 5A again illustrates a three-dimensional lattice structure having cascading units 501(a), 501(b) through 501(n) of solar cell devices 220. In accordance with various embodiments of the present invention, any number of units 501 may be connected in cascading fashion.

Figure 5B:
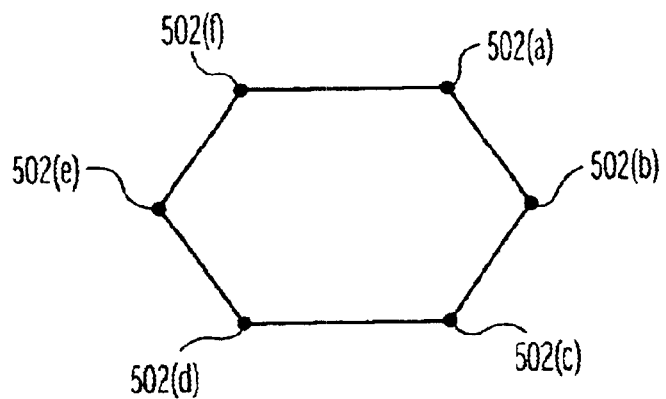
FIG. 5B illustrates a cross-section of a three-dimensional arrangement of solar cell devices according to FIG. 5A.
Figure 5C:
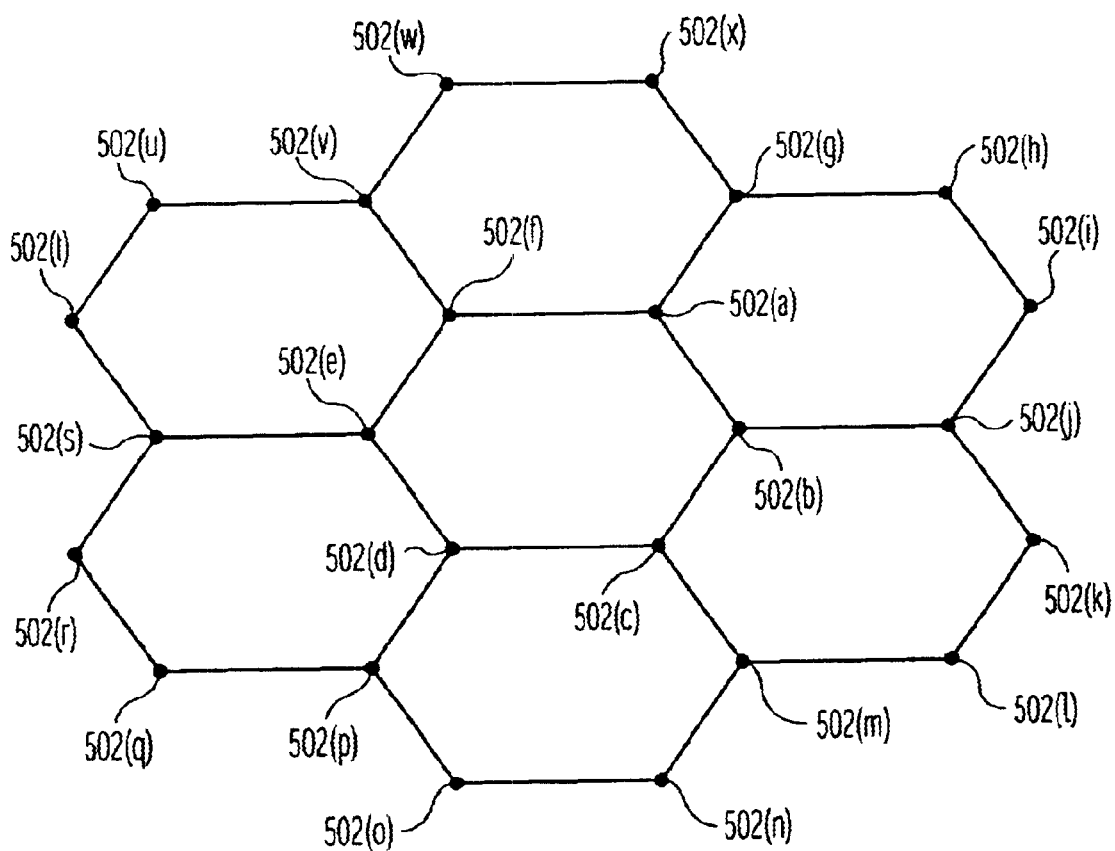
FIG. 5C illustrates an extended cross-section of a three-dimensional arrangement of solar cell devices according to FIG. 5A.

In the embodiment shown in FIG. 5A, the solar cell array 500 comprises six branches and has a hexagonal cross-section. The hexagonal cross-section is also illustrated in FIG. 5B, although the present invention is not limited in scope in this regard. Each of the branches 502(a) through 502(f) of FIG. 5A is designated as branch end nodes 502(a) through 502(f) in FIG. 5B. FIG. 5C illustrates another embodiment, in which the hexagonal cross-section is repeated, on each of its sides, so as to form six additional hexagonal cross-sections with a total of twenty-four branches, wherein the end of each branch is designated by branch end nodes 502(a) through 502(x). The present invention contemplates that any number of branches and any shape of cross-section may be employed.

Returning to FIG. 5A, each unit 501 of the solar cell array 500 comprises corresponding solar cell devices 220 from six branches 502(*a*) through 502(*f*). Each of the branches having the solar cell devices 220 are initially (i.e.—before the first unit) coupled in parallel via current limiting means (such as resistors 503–508). Additional resistors are employed at the output terminals of the last a solar cell devices 220 in each branch (four of these resistors, labeled 509–512, can be seen in FIG. 5A). Beneficially, the values of the resistors employed at the output terminals are selected to optimize the output power of the array 500 by minimizing power that is wasted by one solar cell device driving a second solar cell device. Optionally, one or all of the resistors employed at the output terminals may be eliminated, with a possible reduction in the power output by the solar cell array 500.

In each unit 501, the low voltage side (input) of the solar cell device 220 in a branch is coupled to the high voltage side (output) of the solar cell device 220 in an adjacent branch by a shunt having a solar cell device 220 connected therein, in similarity to the solar cell array 400 of FIG. 4.

Though not shown in FIG. 5A, additional solar cell devices 220 are coupled to branches 502(*d*) and 502(*e*), each of which are also coupled to adjacent branches so as to have shunts with solar cell devices therebetween. In addition, it is noted that, in accordance with various other embodiments of the present invention, each of the branches in a unit may be coupled via shunts to any or all of the other branches in the unit, not merely those that are closest in proximity thereto. Thus, for example, branch 502(*a*) may be coupled via shunts to 502(*c*), 502(*d*) or 502(*e*) in addition to be coupled to branches 502(*b*) and 502(*f*) as shown in FIG. 5A.

The solar cell array 500 has similar advantages as those described above with respect to the solar cell array 400 (e.g., improved power output level, increased level of reliability, etc.).

Figure 6A:
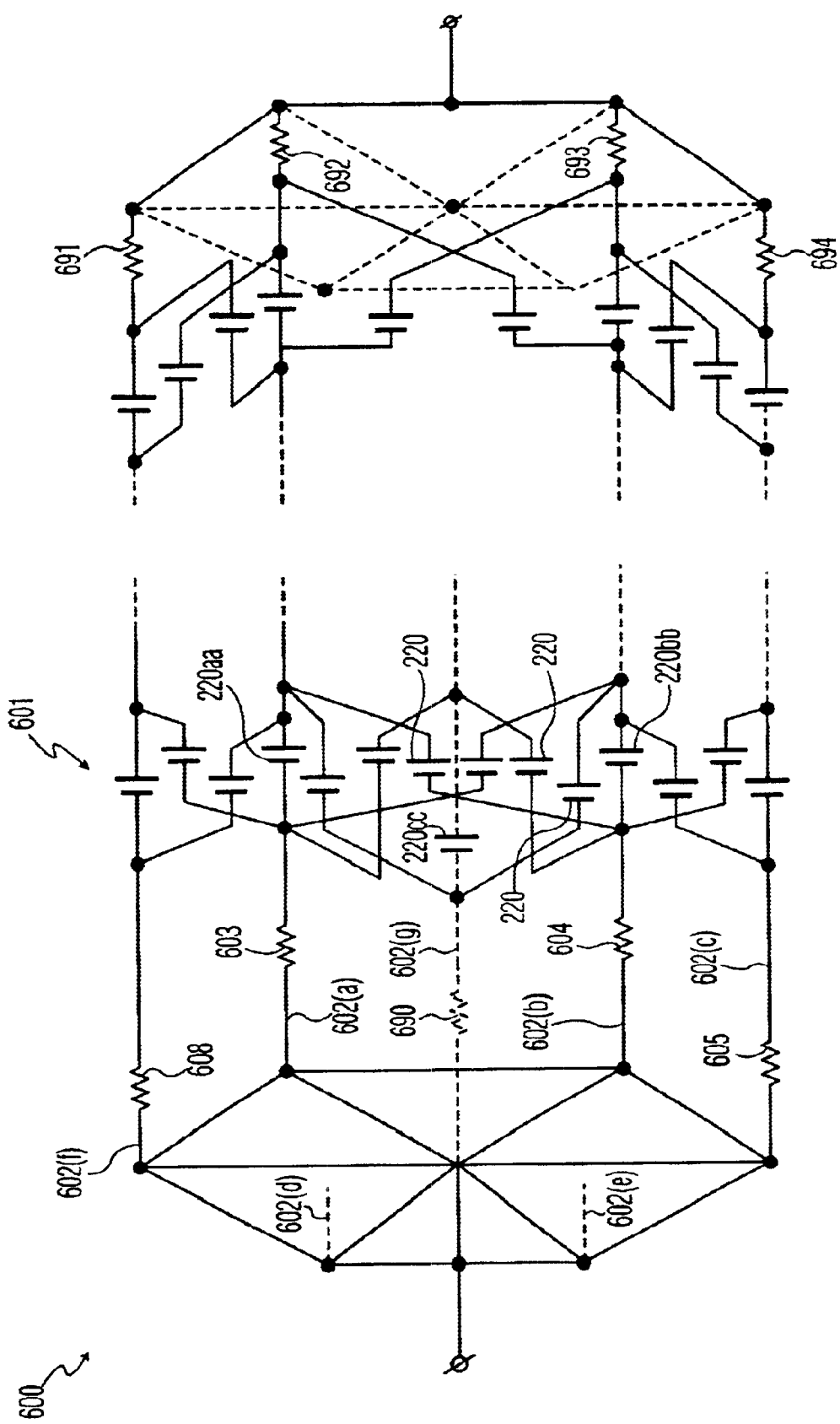
FIG. 6A illustrates still another three-dimensional arrangement solar cell devices.

FIG. 6A illustrates a three-dimensional arrangement 600 of solar cell devices 220 according to still another embodiment of the present invention. The arrangement shown in FIG. 6A again illustrates a three-dimensional lattice structure having cascading units 601 of solar cell devices 220. It is noted that, in accordance with various embodiments of the present invention, any number of units 601 may be connected in cascading fashion.

Figure 6B:
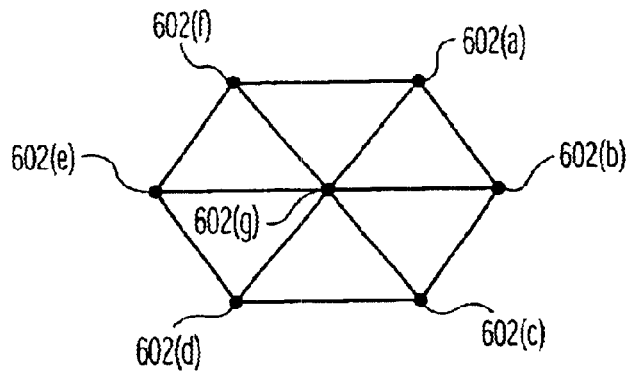
FIG. 6B illustrates a cross-section of the three-dimensional arrangement of solar cell devices according to FIG. 6A.
Figure 6C:
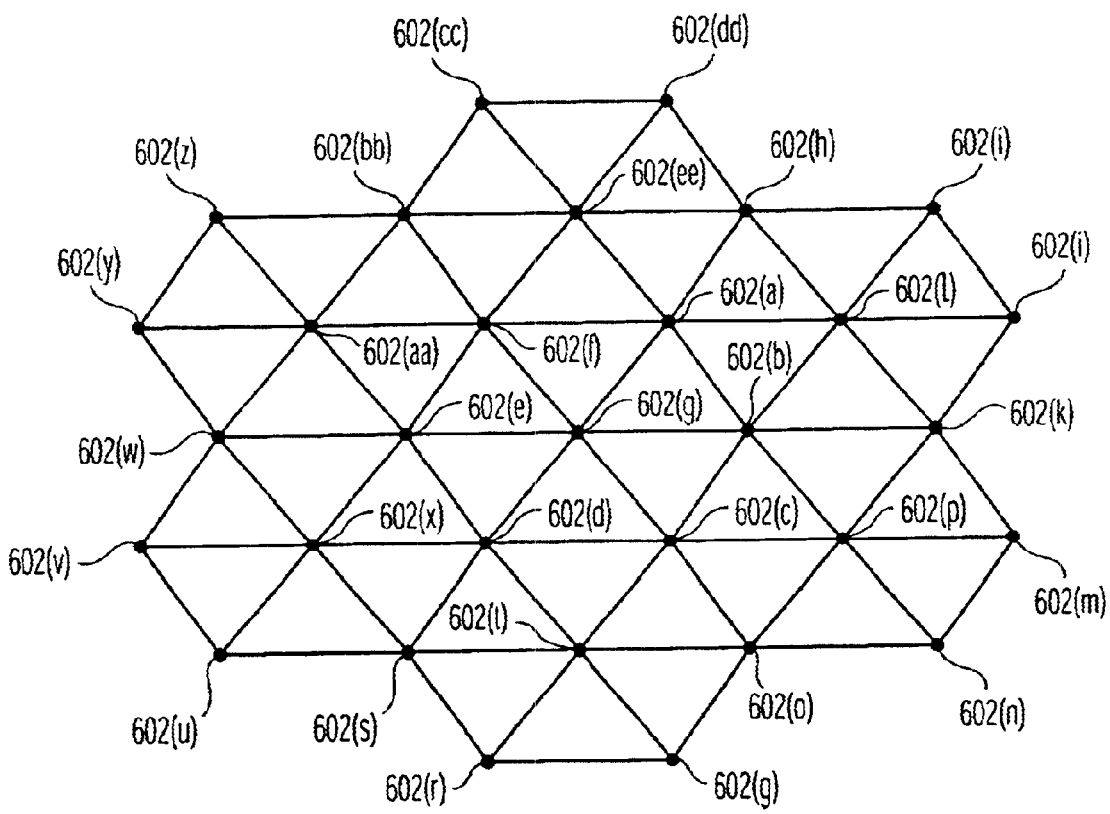
FIG. 6C illustrates an extended cross-section of the three-dimensional arrangement of solar cell devices according to FIG. 6A.

In the embodiment shown in FIG. 6A, the solar cell array 600 comprises seven branches (six outer branches and one central branch) and has a hexagonal cross-section. The hexagonal cross-section is also illustrated in FIG. 6B, although the present invention is not limited in scope in this regard. Each of the branches 602(*a*) through 602(*g*) of FIG. 6A is designated as branch end nodes 602(*a*) through 602(*g*) in FIG. 6B. FIG. 6C illustrates another embodiment, in which the hexagonal cross-section is repeated, on each of its sides, so as to form six additional hexagonal cross-sections with a total of thirty-one branches, wherein the end of each branch is designated by branch end nodes 602(*a*) through 602(*ee*). The present invention contemplates that any number of outer branches and central branches may be employed. It is also noted that the terms "outer" and "central" merely describe one possible proximity, and that the arrangement may be configured differently from that shown in FIG. 6A.

Returning to FIG. 6A, the solar cell array 600 comprises branches 602(*a*) through 602(*g*), each branch having a plurality of solar cell devices 220 coupled in series. A set of corresponding solar cell devices 220 of each branch (together with coupling shunts which are further explained below), comprises a unit 601. Each unit 601 of the solar cell array 600 comprises a set of corresponding solar cell devices 220 from the six outer branches 602(*a*) through 602(*f*). In addition, units 601 comprises a central branch 602(*g*), to which, according to one embodiment, each of the outer branches are connected. According to various other embodiments of the invention, central branch 602(*g*) is coupled to one or more of outer branches 602(*a*) through 602(*f*). Though only a single central branch is shown in FIG. 6A, the present invention contemplates that more than one centrally-disposed branches may be employed.

As previously mentioned, each unit 601 of solar cell array 600 comprises a first solar cell device 220 (such as solar cell device 220*aa*) of branch 602(*a*), a first solar cell device 220 (such as solar cell device 220*bb*) of branch 602(*b*), and a solar cell device 220 (such as solar cell device 220*cc*) of central branch 602(*g*). Each of the branches having the solar cell devices 220 are initially (i.e.—before the first unit) coupled in parallel via current limiting means (such as resistors 603, 604, 605, 608 and 690). Additional resistors 691, 692, etc. are employed at the output terminals of the last a solar cell devices 220 in each branch. Beneficially, the values of the resistors 605 . . . 694 are selected to optimize the output power of the array 600 by minimizing power that is wasted by one solar cell device driving a second solar cell device. Optionally, one or all of the resistors 605 . . . 694 may be eliminated, with a possible reduction in the power output by the solar cell array 500.

The low voltage side (input) of the solar cell device 220 in each branch is coupled to the high voltage side (output) of the solar cell device 220 in an adjacent branch by a shunt having a solar cell device 220 connected therein, in similarity to the solar cell arrays 400 and 500 of FIGS. 4 and 5.

The solar cell array 600 has similar advantages as those described above with respect to the solar cell arrays 400 and 500 (e.g., improved power output level, increased level of reliability, etc.).

Figure 7:
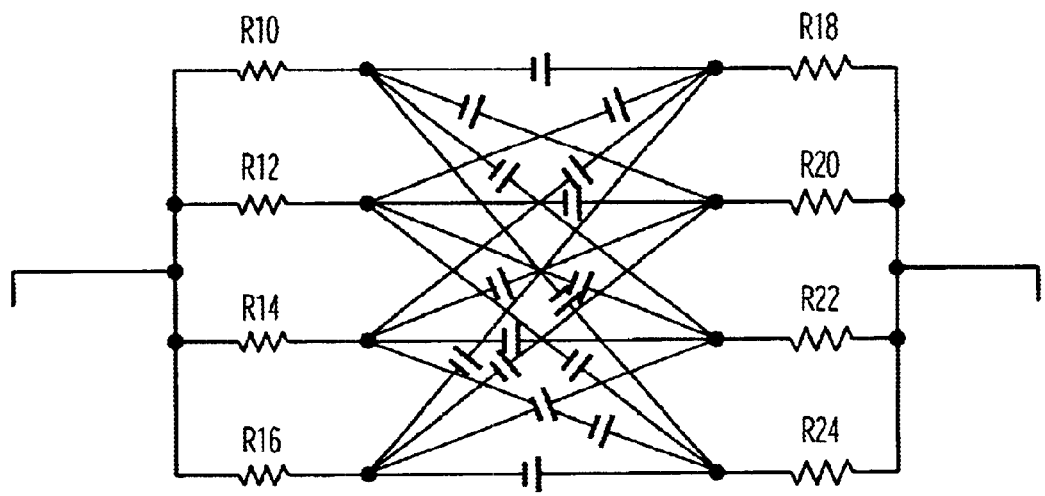
FIG. 7 shows a solar cell array having a matrix structure.

FIG. 7 shows a solar cell array 700 having a matrix structure. As shown in FIG. 7, the low voltage sides (inputs) of each solar cell device 220 are beneficially connected together via resistors R10, R12, R14 and R16. At the other side of the matrix of solar cell devices 220, the high voltage sides (outputs) of each solar cell device 220 are connected together via resistors R18, R20, R22 and R24. As should be apparent when viewing FIG. 7, due to the inclusion of the input and output resistors, no solar cell devices 220 are connected in parallel. Hence, when any one of the solar cell devices 220 fails, power from all of the other solar cell devices 220 may still contribute to the total output power of the solar cell array 700.

Also, the principle of FIG. 7 may be extended to the situation where the number of input nodes is unequal to the number of output nodes.

Figure 8:
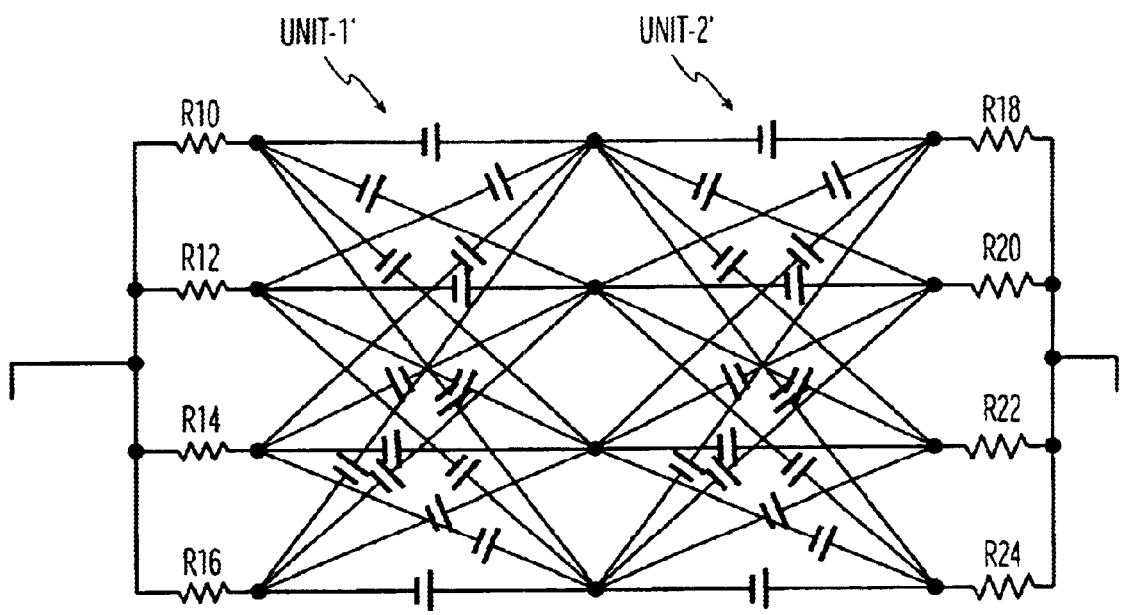
FIG. 8 shows another solar cell array having a matrix structure.

FIG. 8 shows an extension of the embodiment of FIG. 7 in which two of the solar cell device units of FIG. 7, indicated as UNIT-1' and UNIT-2' are serially arranged. It should be noted that the output resistors of UNIT-1' and the input resistors of UNIT-2' are not needed.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

What is claimed is:

1. A solar cell array, comprising:
   a first four-port unit having first and second input ports and first and second output ports; and
   a second four-port unit also having first and second input ports and first and second output ports,
   wherein the first and second output ports of the first four-port unit are connected respectively to the first and second input ports of the second four-port unit, and
   wherein each four-port unit comprises,
      a first solar cell device directly connected between the first input port and the first output port,
      a second solar cell device directly connected between the first input port and the second output port,
      a third solar cell device directly connected between the second input port and the first output port, and
      a fourth solar cell device directly connected between the second input port and the second output port.

2. The solar cell array of claim 1, wherein at least one of the first through fourth solar cell devices comprises a photovoltaic solar cell.

3. The solar cell array of claim 1, wherein at least one of the first through fourth solar cell devices comprises a solar panel comprising a plurality of solar cells.

4. The solar cell array of claim 1, wherein the first and second output ports of the second four-port unit are connected together.

5. The solar cell array of claim 1, further comprising at least one resistor connected between the first and second input ports of the first four-port unit.

6. The solar cell array of claim 1, further comprising:
   a first resistor connected to the first input port of the first four-port unit; and
   a second resistor connected to the second input port of the first four-port unit,
   wherein the first resistor is connected to the second resistor.

7. The solar cell array of claim 6, wherein values of the first and second resistors are selected to maximize a power output by the solar cell array.

8. The solar cell array of claim 1, wherein the first and second input ports of the first four-port unit are directly connected together, and wherein the first and second output ports of the second four-port unit are directly connected together.

9. A solar cell array, comprising:
   a plurality of electrically-conductive branches, said branches coupled in parallel, each of said branches comprising at least one solar cell device; and
   a plurality of shunts, wherein each one of said shunts couples a low voltage terminal of a solar cell device in one of said branches directly to a high voltage terminal of a corresponding solar cell device in an adjacent one of said branches, such that a corresponding set of solar cell devices together with their corresponding coupling shunts define a lattice-connected unit, and wherein said array comprises at least two said units, and said branches along with said shunts are coupled to form a cascaded-cell lattice arrangement having a respective node in each branch between adjoining cells.

10. The solar cell array of claim 9, wherein said shunts each include a solar cell device.

11. The solar cell array of claim 9, wherein each said branch further comprises a current regulating element.

12. The solar cell array of claim 11, wherein said current regulating element is a resistor.

13. The solar cell array of claim 12, wherein each said branch comprises a series of elements, and for each said branch, the resistor is a first element of the series.

14. The solar cell array of claim 9, wherein solar cell devices of each one of said units have different forward voltage characteristics.

15. A method of producing electrical power, comprising the steps of:
   coupling in parallel a plurality of electrically-conductive branches, with said branches forming at least two cascaded units having a respective node in each branch between adjoining units, wherein in each said unit, each said branch has a solar cell device producing electrical power and having a low voltage terminal and a high voltage terminal;
   within each unit, coupling the low voltage terminal of each said solar cell device directly to the high voltage terminal of a solar cell device of an adjacent branch via a shunt; and
   providing the electrical power from the solar cell devices through input and output terminals connected to said branches.

16. The method of claim 15, wherein said method further comprises the step of coupling a solar cell device in each said shunt.

17. The method according to claim 15, wherein solar cell devices of each one of said units are coupled so as to have different electrical power output levels.

18. The method of claim 15 wherein said method further comprises the step of coupling in each branch a current regulating element.

19. The method of claim 18, wherein said step of coupling in each branch a current regulating element comprises coupling a resistor in each branch.

20. The method of claim 19, wherein said step of coupling a resistor in each branch comprises forming each branch as a series of elements, and further comprises coupling said resistor as a first element in each said branch.

21. The method of claim 19, wherein said step of coupling in each branch a respective resistor comprises forming each branch as a series of elements, and further comprises coupling said respective resistor as a first element in each said branch.

22. The method according to claim 19, wherein the plurality of electrically-conductive branches comprises at least three branches, and said step of coupling via a shunt comprises connecting four respective said shunts to at least one of said nodes, two of said four respective said shunts being in one of said adjoining units, and the other two of said four respective said shunts being in another adjoining unit.

23. The method of claim 15, wherein each of the electrically-conductive branches does not include a resistor, and wherein the step of coupling in parallel the plurality of electrically-conductive branches includes directly connecting inputs of the electrically conductive branches together and directly connecting outputs of the electrically conductive branches together.

* * * * *